United States Patent
Lee

(10) Patent No.: US 8,796,847 B2
(45) Date of Patent: Aug. 5, 2014

(54) PACKAGE SUBSTRATE HAVING MAIN DUMMY PATTERN LOCATED IN PATH OF STRESS

(75) Inventor: Jong-Joo Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 345 days.

(21) Appl. No.: 13/198,738

(22) Filed: Aug. 5, 2011

(65) Prior Publication Data

US 2012/0049351 A1    Mar. 1, 2012

(30) Foreign Application Priority Data

Aug. 24, 2010 (KR) ........................ 10-2010-0081857

(51) Int. Cl.
| | |
|---|---|
| H01L 23/498 | (2006.01) |
| H01L 23/48 | (2006.01) |
| H05K 3/34 | (2006.01) |
| H05K 1/11 | (2006.01) |
| H01L 25/065 | (2006.01) |
| H01L 23/00 | (2006.01) |
| H05K 1/02 | (2006.01) |
| H01L 23/31 | (2006.01) |

(52) U.S. Cl.
CPC .............. H05K 1/111 (2013.01); H05K 3/3436 (2013.01); H01L 2224/1712 (2013.01); H01L 2224/06179 (2013.01); H05K 2201/09781 (2013.01); H01L 2224/0603 (2013.01); H05K 1/0271 (2013.01); H01L 2225/06541 (2013.01); H01L 2224/16146 (2013.01); H05K 2201/09418 (2013.01); H04L 2225/06513 (2013.01); H05K 2201/10674 (2013.01); H01L 2224/1703 (2013.01); H01L 23/49838 (2013.01); H01L 23/3128 (2013.01); H01L 2224/16227 (2013.01); H01L 2225/06517 (2013.01); H01L 2924/01047 (2013.01); H01L 25/0657 (2013.01); H01L 24/17 (2013.01); H01L 2224/05552 (2013.01); H01L 2224/06154 (2013.01); H01L 2224/06152 (2013.01); H01L 2924/014 (2013.01); H01L 2224/06051 (2013.01); H01L 2224/17517 (2013.01); H01L 2224/06517 (2013.01); H01L 2924/01033 (2013.01); H01L 2225/06568 (2013.01); H01L 24/06 (2013.01)
USPC .......................................... 257/737; 257/786

(58) Field of Classification Search
CPC . H01L 23/498; H01L 23/48; H01L 23/49838; H01L 24/06; H01L 24/17; H01L 25/0657; H05K 1/111; H05K 3/3436
USPC ...................... 257/737, 786, E23.068, E23.01
See application file for complete search history.

(56) References Cited

U.S. PATENT DOCUMENTS

| | | | |
|---|---|---|---|
| 2002/0119583 A1* | 8/2002 | Seshan | 438/17 |
| 2006/0016619 A1* | 1/2006 | Jang et al. | 174/260 |
| 2006/0076681 A1* | 4/2006 | Tsao et al. | 257/758 |
| 2007/0152350 A1* | 7/2007 | Kim et al. | 257/786 |
| 2008/0073784 A1* | 3/2008 | Lee | 257/738 |

FOREIGN PATENT DOCUMENTS

| | | |
|---|---|---|
| JP | 2006-040261 | 2/2006 |
| KR | 1020000040592 | 7/2000 |
| KR | 1020080114059 | 12/2008 |

* cited by examiner

*Primary Examiner* — Walter H Swanson
(74) *Attorney, Agent, or Firm* — F. Chau & Associates, LLC

(57) ABSTRACT

A package substrate includes an insulating substrate, a functional pattern and a main dummy pattern. A semiconductor chip is arranged on the insulating substrate. The functional pattern is formed on the insulating substrate. The functional pattern is electrically connected to the semiconductor chip. The main dummy pattern is formed on a portion of the insulating substrate at least of to the outside of and/or adjacent the functional pattern in a path of stress generated by a difference between thermal expansion coefficient of the insulating substrate and the semiconductor chip, so as to divert the stress away from the functional pattern. Thus, the stress is not concentrated on the functional pattern. As a result, damage to the functional bump caused by the stress is prevented.

18 Claims, 7 Drawing Sheets

PACKAGE SUBSTRATE HAVING MAIN DUMMY PATTERN LOCATED IN PATH OF STRESS

CROSS-REFERENCE TO RELATED APPLICATION

This application claims priority under 35 USC §119 to Korean Patent Application No. 2010-81857, filed on Aug. 24, 2010 in the Korean Intellectual Property Office (KIPO), the contents of which are herein incorporated by reference in their entirety.

BACKGROUND

1. Field

Example embodiments relate to a package substrate and a flip chip package including the same. More particularly, example embodiments relate to a package substrate electrically connected to a semiconductor chip via conductive bumps, and a flip chip package including the package substrate.

2. Discussion of the Related Art

A plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

The semiconductor package may include an electrical connecting member configured to electrically connect the semiconductor chip with a package substrate. The electrical connecting member may include a conductive wire, and/or a conductive bump.

A semiconductor package including a conductive bump configured to electrically connect the package substrate with the semiconductor chip is referred to as a flip chip package.

In the flip chip package, a difference between thermal expansion coefficients of the semiconductor chip and the package substrate may be large. Thus, relatively large stresses may be applied to the package substrate due to high heat generated during operation of the flip chip package. The stresses may damage the conductive bump, so that an electrical connection between the package substrate and the semiconductor chip may be cut off.

SUMMARY

Example embodiments provide a package substrate having a structure that is capable of reducing stresses applied to the package substrate.

Example embodiments also provide a flip chip package including the package substrate.

According to some example embodiments, there is provided a package substrate. The package substrate includes an insulating substrate, a functional pattern and a main dummy pattern. A semiconductor chip is arranged on the insulating substrate. The functional pattern is formed on the insulating substrate. The functional pattern is electrically connected to the semiconductor chip. The main dummy pattern is formed on a portion of the insulating substrate at least one of to the outside of and/or adjacent the functional pattern in a path of stress generated by a difference between thermal expansion coefficient of the insulating substrate and the semiconductor chip, so as to divert the stress away from the functional pattern.

In some example embodiments, the main dummy pattern may be substantially perpendicular to a heading direction of the stress. Further, the main dummy pattern may have an area greater than that of the functional pattern.

In some example embodiments, the package substrate may further include auxiliary dummy patterns surrounding and/or adjacent the functional pattern. The auxiliary dummy patterns may be substantially perpendicular to the heading direction of the stress. The auxiliary dummy patterns may have an area greater than that of the functional pattern.

In some example embodiments, the functional pattern may be substantially parallel with the heading direction of the stress.

According to some example embodiments, there is provided a flip chip package. The flip chip package includes a semiconductor chip, a package substrate, a functional bump and a main dummy bump. The package substrate includes an insulating substrate, a functional pattern and a main dummy pattern. The semiconductor chip is arranged on the insulating substrate. The functional pattern is formed on the insulating substrate. The functional pattern is electrically connected to the semiconductor chip. The main dummy pattern is formed on a portion of the insulating substrate at least one of to the outside of and/or adjacent the functional pattern. The functional bump is mounted on the functional pattern to electrically connect the functional pattern with the semiconductor chip. The main dummy bump is mounted on the main dummy pattern. The main dummy bump is positioned at least one to the outside of and/or adjacent the functional bump in a path of stress generated by a difference between thermal expansion coefficient of the insulating substrate and the semiconductor chip, so as to divert the stress away from the functional pattern.

In some example embodiments, the main dummy bump may have a size greater than that of the functional pattern. A floating pad may be interposed between the main dummy bump and the semiconductor chip.

In some example embodiments, the package substrate may further include auxiliary dummy patterns surrounding and/or adjacent the functional pattern. Auxiliary dummy bumps may be mounted on the auxiliary dummy patterns. The auxiliary dummy bumps may have a size greater than that of the functional bump. A floating pad may be interposed between the auxiliary dummy bump and the semiconductor chip.

In some example embodiments, the flip chip package may further include a molding member formed on the package substrate to cover semiconductor chip.

In some example embodiments, the flip chip package may further include external terminals mounted on a lower surface of the package substrate.

According to some example embodiments, there is provided a flip chip package. The flip chip package includes a first semiconductor chip, a second semiconductor chip, a package substrate, a functional bump and a main dummy bump. The package substrate includes an insulating substrate, a functional pattern and a main dummy pattern. The functional pattern is formed on the insulating substrate. The main dummy pattern is formed on a portion of the insulating substrate at least one of to the outside of and/or adjacent the functional pattern. The first semiconductor chip is mounted on the package substrate. A plug is formed through the first semiconductor chip. The functional bump is interposed between the plug and the functional pattern to electrically connect the functional pattern with the first semiconductor chip. The main dummy bump is mounted on the main dummy pattern. The main dummy bump is positioned at least one of to the outside of and/or adjacent the functional bump in a path of stress generated by a difference between thermal expansion coefficient of the insulating substrate and the first semiconductor chip, so as to divert the stress away from the functional pattern.

In some example embodiments, the first semiconductor chip may have a face-down structure where an active region may be arranged facing the package substrate.

In some example embodiments, the first semiconductor chip may have a face-up structure where an active region may be arranged away from the package substrate.

In some example embodiments, the plug may be positioned at an edge portion of the first semiconductor chip that does not make contact with the second semiconductor chip.

In some example embodiments, the plug may be positioned at a central portion of the first semiconductor chip that makes contact with the second semiconductor chip.

According to some example embodiments, there is provided a package substrate comprising an insulating substrate on which a semiconductor chip is arranged, a functional pattern formed on the insulating substrate, wherein the functional pattern is electrically connected to the semiconductor chip, and a main dummy pattern formed on a portion of the insulating substrate at least one of to the outside of and/or adjacent the functional pattern. The main dummy pattern is oriented differently than the functional pattern with respect to a direction of stress on the insulating substrate generated by a difference between thermal expansion coefficients of the insulating substrate and the semiconductor chip.

According to some example embodiments, there is provided a method of manufacturing a package substrate comprising arranging a semiconductor chip on an insulating substrate, forming a functional pattern on the insulating substrate, wherein the functional pattern is electrically connected to the semiconductor chip, and forming a main dummy pattern on a portion of the insulating substrate at least one of to the outside of and/or adjacent the functional pattern, wherein the main dummy pattern is oriented in a path of stress on the insulating substrate generated by a difference between thermal expansion coefficients of the insulating substrate and the semiconductor chip.

According to some example embodiments, the stresses are concentrated on the main dummy pattern arranged outside and/or adjacent the functional pattern. Thus, the stresses are not concentrated on the functional pattern. As a result, damage to the functional bumps caused by the stresses may be prevented.

BRIEF DESCRIPTION OF THE DRAWINGS

Example embodiments will be more clearly understood from the following detailed description taken in conjunction with the accompanying drawings.

FIG. 1 is a plan view illustrating a package substrate in accordance with some example embodiments;

FIG. 2 is an enlarged plan view of a portion "II" in FIG. 1;

FIG. 3 is a plan view illustrating a package substrate in accordance with some example embodiments;

FIG. 4 is an enlarged plan view of a portion "IV" in FIG. 3;

FIG. 5 is a cross-sectional view illustrating a flip chip package in accordance with some example embodiments;

FIG. 6 is an enlarged cross-sectional view of a portion "VI" in FIG. 5;

FIG. 7 is a cross-sectional view illustrating a flip chip package in accordance with some example embodiments;

FIG. 8 is a cross-sectional view illustrating a flip chip package in accordance with some example embodiments;

FIG. 9 is a cross-sectional view illustrating a flip chip package in accordance with some example embodiments; and FIG. 10 is a cross-sectional view illustrating a flip chip package in accordance with some example embodiments.

DETAILED DESCRIPTION OF THE EMBODIMENTS

Figure 1:
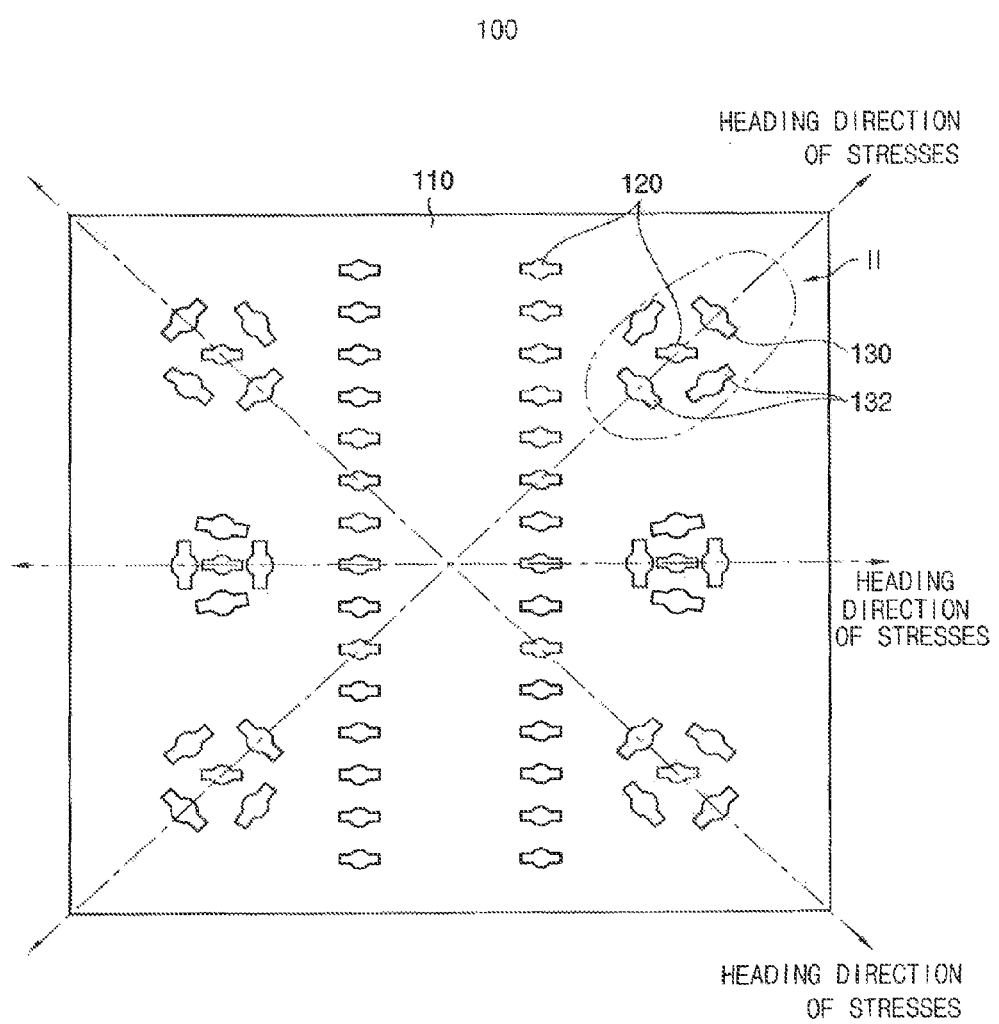
FIGS. 1 to 10 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout.

Figure 2:
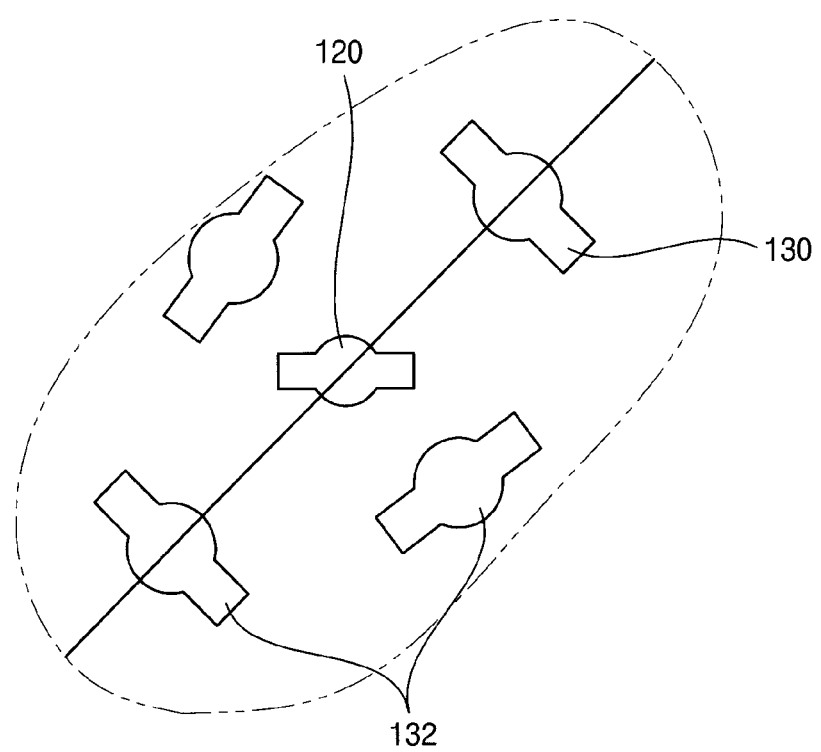

FIG. 1 is a plan view illustrating a package substrate in accordance with some example embodiments, and FIG. 2 is an enlarged plan view of a portion "II" in FIG. 1.

Referring to FIGS. 1 and 2, a package substrate 100 includes an insulating substrate 110, functional patterns 120, main dummy patterns 130 and auxiliary dummy patterns 132.

In some example embodiments, the insulating substrate 110 has a rectangular shape. The insulating substrate 110 supports a semiconductor chip. The semiconductor chip is arranged on an upper surface of the insulating substrate 110. Particularly, in accordance with an embodiment, the semiconductor chip is arranged on a central portion of an upper surface of the insulating substrate 110.

In some example embodiments, the insulating substrate 110 includes an insulating material, such as oxide. The semiconductor chip includes silicon. Because a difference between thermal expansion coefficients of the oxide and the silicon is large, a difference between thermal expansion coefficients of the insulating substrate 110 and the semiconductor chip is also large. When the semiconductor chip on the upper surface of the insulating substrate 110 is operated, high heat is applied to the semiconductor chip and the insulating substrate 110. Thus, stresses are applied to the insulating substrate 110 along the arrows in FIG. 1. That is, the insulating substrate 110 expands in the directions of the arrows.

The functional patterns 120 are arranged on the upper surface of the insulating substrate 110. Functional bumps (not shown) are mounted on the functional patterns 120. Thus, the semiconductor chip is electrically connected to the functional patterns 120 via the functional bumps. In some example embodiments, the functional patterns 120 are arranged on a central portion and an edge portion of the upper surface of the insulating substrate 110. The functional patterns 120 on the central portion of the upper surface of the insulating substrate 110 receive signals from the semiconductor chip. The functional patterns 120 on the edge portion of the upper surface of the insulating substrate 110 are used for power, grounding, and the like.

In some example embodiments, the functional patterns 120 are parallel with each other. Particularly, the functional patterns 120 are parallel with a side face of the insulating substrate 110.

The main dummy patterns 130 are arranged on the edge portion of the upper surface of the insulating substrate 110. Main dummy bumps (not shown) are mounted on the main dummy patterns 130. The main dummy bumps relieve at least some of the stresses applied to the insulating substrate 110. For example, the stresses are concentrated on the main dummy bumps, so that the main dummy bumps relieve the stresses applied to the functional bumps.

The stresses are gradually increased along the heading direction of the stresses, i.e., the expansion direction of the insulating substrate 110 as indicated by the arrows. In order to effectively relieve the stresses applied to the functional patterns 120, the main dummy patterns 130 are arranged outside and/or adjacent the functional patterns 120 so that the heading direction of the stresses passes through the main dummy patterns 130. At least some of the main dummy patterns 130 are located closer to the side face of the insulating substrate 110 than the functional patterns 120.

Additionally, in order to effectively relieve the stresses applied to the functional patterns 120, the main dummy patterns 130 have a shape on which the stresses are concentrated. In some example embodiments, the main dummy patterns 130 are arranged substantially perpendicular to the heading direction of the stresses. That is, the main dummy patterns 130 have a lengthwise direction substantially perpendicular to the heading direction of the stresses. The main dummy patterns 130 substantially perpendicular to the heading direction of the stresses obstruct the heading of the stresses. Therefore, the stresses are concentrated on the main dummy patterns 130. As a result, the stresses are concentrated on the dummy bumps on the main dummy patterns 130, not on the functional bumps on the functional patterns.

In some example embodiments, the main dummy bumps are not electrically connected to the semiconductor chip. Thus, the main dummy patterns 130 where the main dummy bumps are not electrically connected are not electrically connected to the semiconductor chip. Therefore, although the dummy bumps may be damaged due to the stresses, it will have no influence on operations of the semiconductor chip if the dummy bumps are not electrically connected to the semiconductor chip.

The stress concentrations on the functional bumps are effectively prevented by arranging the main dummy bumps adjacent to the functional bumps. In addition, the auxiliary dummy patterns 132 are arranged surrounding the functional patterns 120. Auxiliary dummy bumps (not shown) are mounted on the auxiliary dummy patterns 132.

In some example embodiments, the auxiliary dummy patterns 132 have an area substantially the same as that of the main dummy patterns 130. Further, the auxiliary dummy patterns 132 are arranged substantially perpendicular to the heading direction of the stresses.

In some example embodiments, the stresses are relieved by increasing the size of the dummy bumps. Because the size of the dummy bumps is dependent upon areas of the main dummy patterns 130 and the auxiliary dummy patterns 132, the areas of the main dummy patterns 130 and the auxiliary dummy patterns 132 are greater than the areas of the functional patterns 120.

Alternatively, although not depicted in drawings, in order to reinforce strength of the functional patterns 120 with respect to the stresses, the functional patterns 120 are connected to the adjacent main dummy patterns 130 and auxiliary dummy patterns 132.

In some example embodiments, the arrangements and the directions of the main dummy patterns 130, the auxiliary dummy patterns 132 and the functional patterns 120 as depicted in FIGS. 1 and 2, are based on the semiconductor chip being located on the central portion of the upper surface of the insulating substrate 110. Alternatively, because the heading direction of the stresses is affected by the positions of the semiconductor chip on the insulating substrate 110, the arrangements and the directions of the main dummy patterns 130, the auxiliary dummy patterns 132 and the functional patterns 120 may vary in accordance with the positions of the semiconductor chip on the insulating substrate.

Referring to FIGS. 1 and 2, the stresses are concentrated on the main dummy patterns outside and/or adjacent the functional patterns. Further, the stresses are more concentrated on the main dummy patterns substantially perpendicular to the heading direction of the stresses. Thus, stress on the functional patterns is suppressed or reduced.

Figure 3:
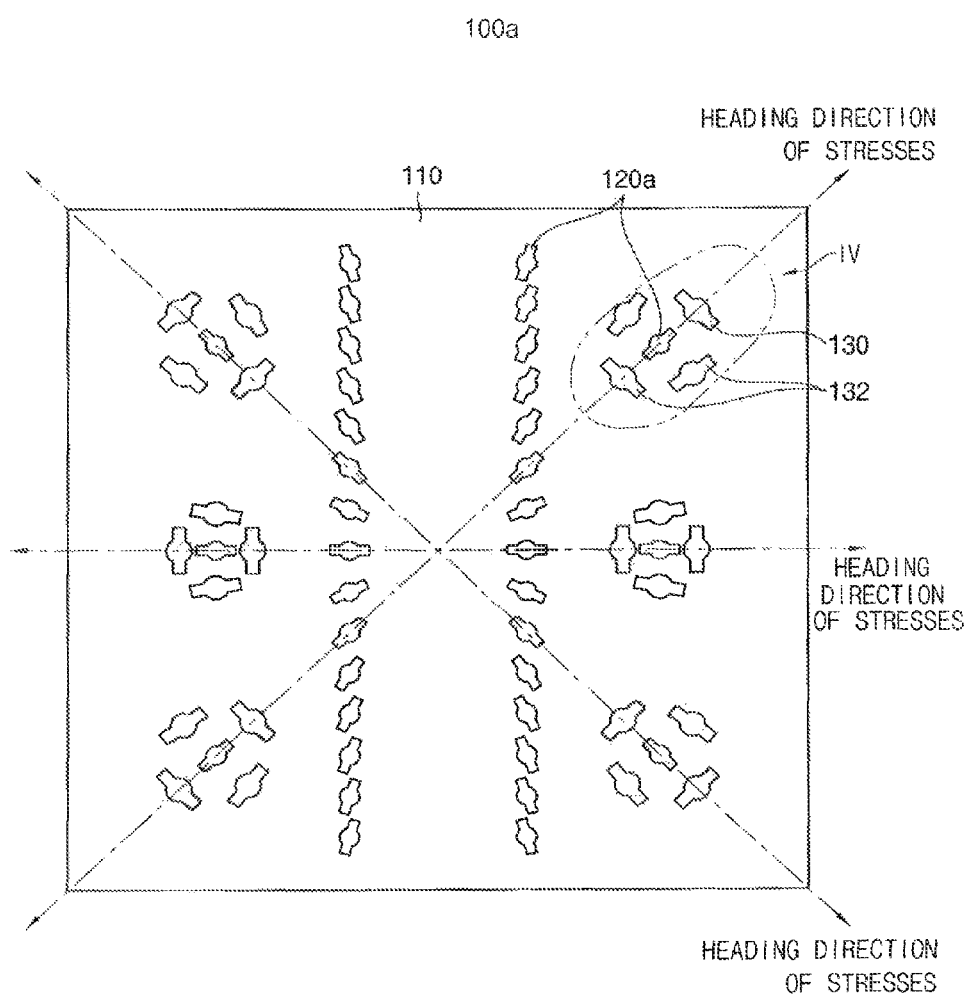
Figure 4:
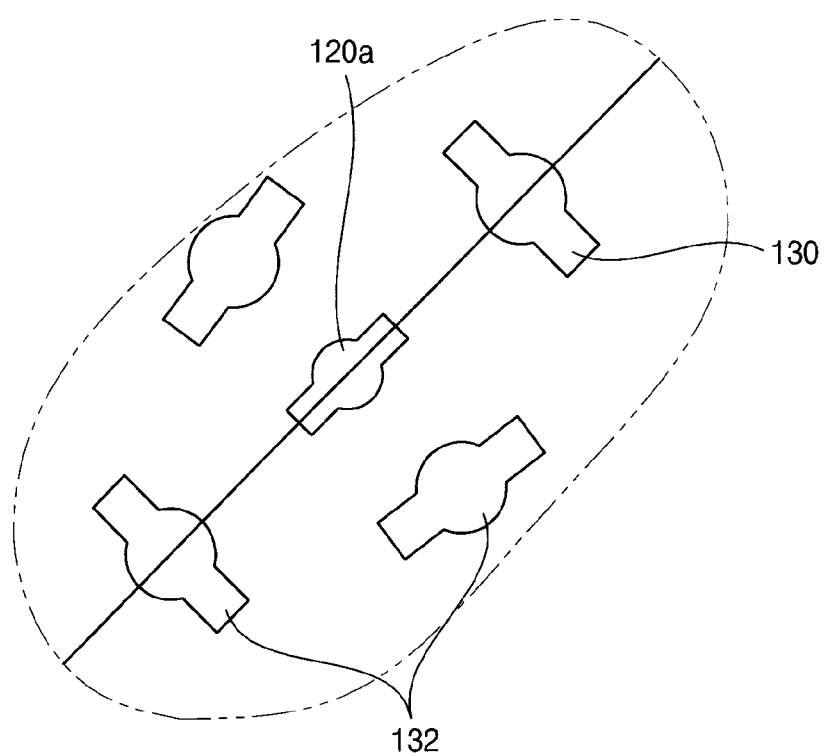

FIG. 3 is a plan view illustrating a package substrate in accordance with some example embodiments, and FIG. 4 is an enlarged plan view of a portion "IV" in FIG. 3.

A package substrate 100a of this example embodiment includes elements substantially the same as those of the package substrate 100 in FIG. 1 except for functional patterns.

Referring to FIGS. 3 and 4, the functional patterns 120a of this example embodiment are arranged substantially parallel with the heading direction of the stresses. The functional patterns 120a substantially parallel with the heading direction of the stresses do not obstruct the heading of the stresses. Thus, the stresses are not concentrated on the functional patterns 120a having a lengthwise direction substantially parallel with the heading direction of the stresses. As a result, because the stresses are not concentrated on the functional patterns 120a, the stresses are not concentrated on functional bumps mounted on the functional patterns 120a.

According to this example embodiment, the functional patterns are substantially parallel with the heading direction of the stresses, so that the stresses are not concentrated on the functional patterns. As a result, damage to the functional bumps caused by the stresses may be suppressed.

Figure 5:
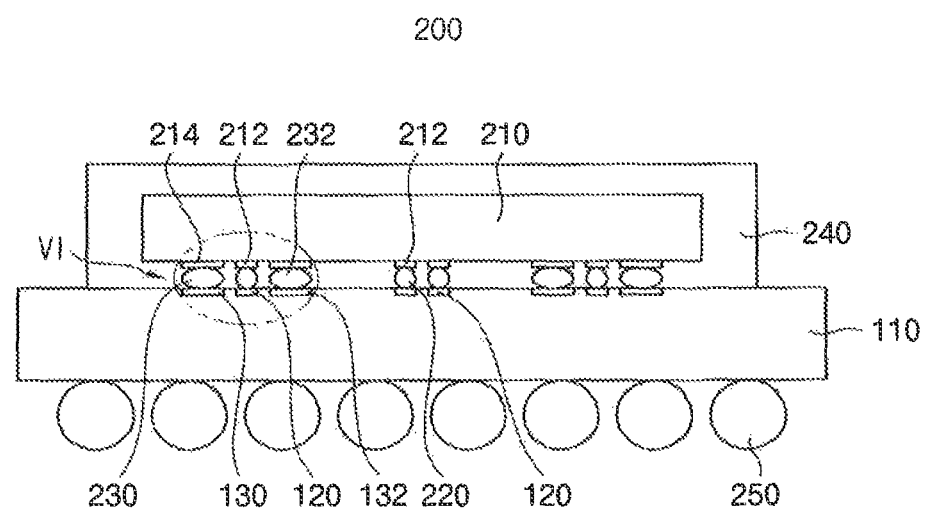
Figure 6:
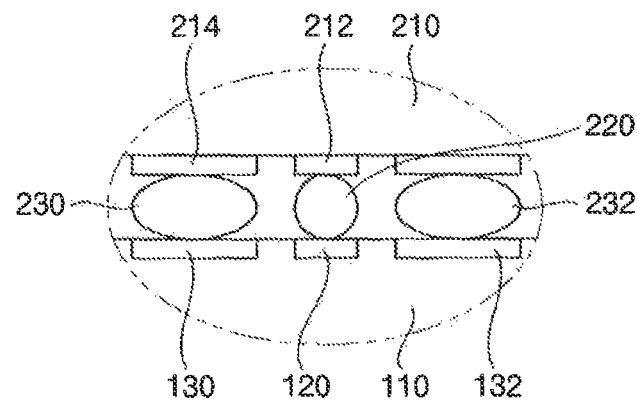

FIG. 5 is a cross-sectional view illustrating a flip chip package in accordance with some example embodiments, and FIG. 6 is an enlarged cross-sectional view of a portion "VI" in FIG. 5.

Referring to FIGS. 5 and 6, a flip chip package 200 of this example embodiment includes a package substrate 100, a semiconductor chip 210, functional bumps 220, main dummy bumps 230, auxiliary dummy bumps 232, a molding member 240 and external terminals 250.

The package substrate 100 of this example embodiment includes elements substantially the same as those of the package substrate 100 in FIG. 1. Alternatively, the flip chip package 200 may include the package substrate 100a in place of the package substrate 100 in FIG. 1.

The semiconductor chip 210 is arranged over the package substrate 100. In some example embodiments, the semiconductor chip 210 has an active region where bonding pads 212 are arranged. The active region is electrically connected to structures in the semiconductor chip 210. The active region is positioned on a lower surface of the semiconductor chip 210. That is, the active region is arranged facing the package substrate 100. Thus, the semiconductor chip 210 having the active region may correspond to a face-down semiconductor chip.

Additionally, the semiconductor chip 210 includes floating pads 214. The floating pads 214 are not be electrically connected with the structures in the semiconductor chip 210. In some example embodiments, the floating pads 214 include a metal.

The functional bumps 220 are interposed between the semiconductor chip 210 and the package substrate 100. In some example embodiments, the functional bumps 220 are interposed between the bonding pads 212 of the semiconductor chip 210 and the functional patterns 120 of the package substrate 100 to electrically connect the bonding pads 212 with the functional patterns 120. Thus, electrical signals from the semiconductor chip 210 are transmitted to the functional patterns 120 of the package substrate 100 through the bonding pads 212 and the functional bumps 220.

When the flip chip package 200 includes the package substrate 100a of FIG. 3, the stresses are not concentrated on the functional patterns 120a substantially parallel with the heading direction of the stresses. Thus, the stresses are also not concentrated on the functional bumps 220 on the functional patterns 120a. As a result, damage to the functional bumps 220 caused by the stresses is suppressed or reduced.

The main dummy bumps 230 are interposed between the semiconductor chip 210 and the package substrate 100. In some example embodiments, the main dummy bumps 230 are interposed between a passivation layer (not shown) on a lower surface of the semiconductor chip 210 and the main dummy patterns 130 of the package substrate 100. In other words, the main dummy bumps 230 are mounted on the main dummy patterns 130. Because the main dummy bumps 230 are not electrically connected with the structures in the semiconductor chip 210, electrical signals from the semiconductor chip 210 are not transmitted to the main dummy patterns 130.

The main dummy bumps 230 are arranged to the outside of and/or adjacent the functional bumps 220. As a result, the stresses applied to the functional bumps 220 are concentrated on the main dummy bumps 230. Further, because the main dummy patterns 130 are substantially perpendicular to the heading direction of the stresses, the stresses are concentrated on the main dummy patterns 130. Therefore, the stresses are more concentrated on the main dummy bumps 230 on the main dummy patterns 130. That is, the stresses are concentrated on the main dummy bumps 230, not on the functional bumps 220. As a result, damage to the functional bumps 220 caused by the stresses is suppressed.

In some example embodiments, the auxiliary dummy bumps 232 are mounted on the auxiliary dummy patterns 132. In accordance with an embodiment, the auxiliary dummy bumps 232 surround some or each of the functional bumps 220. The auxiliary dummy bumps 232 near the functional bumps 220 may effectively absorb the stresses oriented toward the functional bumps 220.

In some example embodiments, the main dummy bumps 230 and the auxiliary dummy bumps 232 do not correspond to electrical connections between the semiconductor chip 210 and the package substrate 100. Thus, even if the main dummy bumps 230 and the auxiliary dummy bumps 232 are damaged, there is no interruption of electrical signals flowing between the semiconductor chip and the package substrate.

In some example embodiments, as mentioned above, the main dummy patterns 130 and the auxiliary dummy patterns 132 have the areas greater than that of the functional patterns 120. Correspondingly, the main dummy bumps 230 and the auxiliary dummy bump 232 also have sizes greater than that of the functional bumps 220. As a result, the larger main dummy bumps 230 and the larger auxiliary dummy bumps 232 effectively relieve the stresses on the functional bumps 220.

In some example embodiments, the main dummy bumps 230 and the auxiliary dummy bumps 232 are fixed to the floating pads 214 of the semiconductor chip 210. The main dummy bumps 230 and the auxiliary dummy bumps 232 fixed to the floating pads 214 have a bonding strength greater than that of dummy bumps fixed to the passivation layer. Thus, the main dummy bumps 230 and the auxiliary dummy bumps 232 fixed to the floating pads 214 more effectively relieve the stresses than those dummy bumps fixed to the passivation layer without the floating pads 214.

The molding member 240 is formed on the package substrate 100 to cover the semiconductor chip 210. In some example embodiments, the molding member 240 protects the functional patterns 120 of the package substrate 100, the semiconductor chip 210 and the functional bumps 220 from external environments. According to an embodiment, the molding member 240 includes an epoxy molding compound (EMC).

The external terminals 250 are mounted on a lower surface of the package substrate 100. In accordance with an embodiment, the external terminals 250 are electrically connected to the functional patterns 120 of the package substrate 100. Thus, the electrical signals from the semiconductor chip 210 are transmitted to the external terminals 250 through the bonding pads 212, the functional bumps 220 and the functional patterns 120. In some example embodiments, the external terminals 250 include a solder ball.

According to the example embodiments, the stresses are concentrated on the dummy bumps, not the functional bumps. Thus, damage to the functional bumps caused by the stresses is suppressed.

Figure 7:
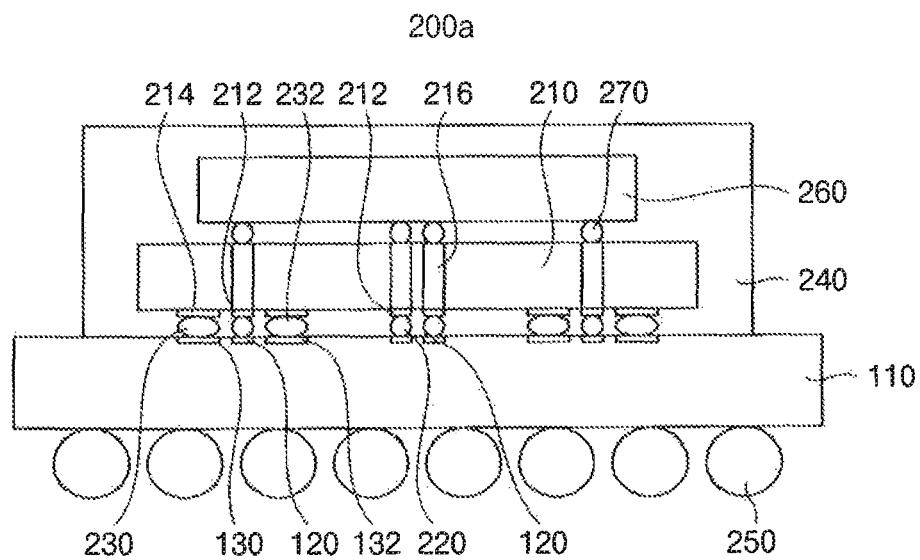

FIG. 7 is a cross-sectional view illustrating a flip chip package in accordance with some example embodiments.

A flip chip package substrate 200a of this example embodiment includes elements substantially the same as those of the package substrate 200 in FIG. 5 and further includes a second semiconductor chip. Alternatively, the flip chip package 200a may include the package substrate 100a in FIG. 3 in place of the package substrate 100 in FIG. 1.

Referring to FIG. 7, the flip chip package 200a of this example embodiment further includes the second semiconductor chip 260 stacked on the first semiconductor chip 210. The flip chip package 200a of this example embodiment corresponds to a multi-chip package having a structure in which a plurality of semiconductor chips are sequentially stacked.

In some example embodiments, the second semiconductor chip 260 is electrically connected with the first semiconductor chip 210 via second functional bumps 270. The first semiconductor chip 210 includes plugs 216 configured to electrically make contact with the second functional bumps 270. The plugs 216 are formed through the first semiconductor chip 210 in a vertical direction to electrically connect the second functional bumps 270 with the bonding pads 212 of the first semiconductor chip 210.

In some example embodiments, the plugs 216 extend in the vertical direction from the first functional bumps 220. Thus, the plugs 216 are positioned to the inside of the main dummy bumps 230. As a result, the main dummy bumps 230 protect the plugs 216 and the first functional bumps 220 from the stresses.

Figure 8:
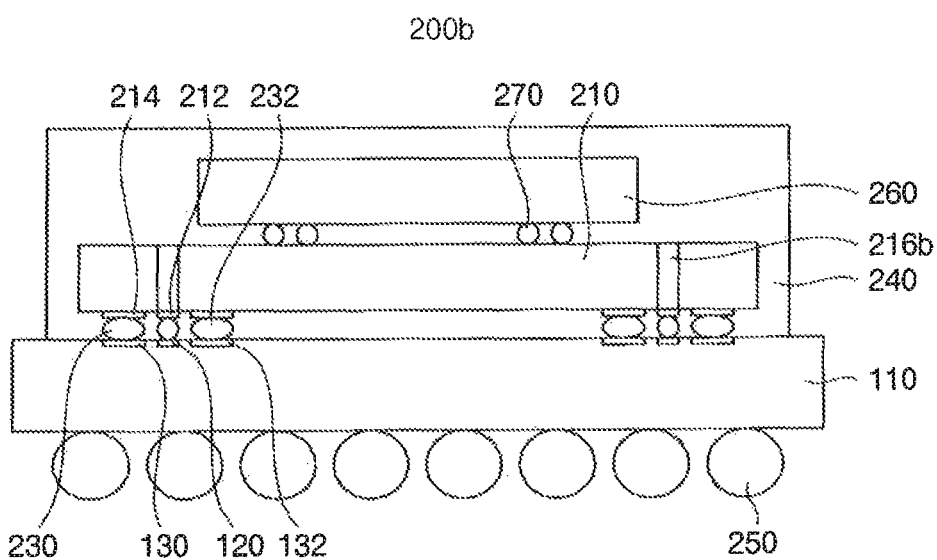

FIG. 8 is a cross-sectional view illustrating a flip chip package in accordance with some example embodiments.

A flip chip package substrate 200b of this example embodiment includes elements substantially the same as those of the package substrate 200a in FIG. 7 except for a first semiconductor chip.

Referring to FIG. 8, the flip chip package 200b of this example embodiment corresponds to a memory-LSI type package. That is, the first semiconductor chip 210 includes a logic chip, and the second semiconductor chip 260 includes a memory chip.

The first semiconductor chip 210 includes plugs 216b. The plugs 216b are vertically disposed in the edge portion of the first semiconductor chip 210 that does not make contact with the second semiconductor chip 260. Thus, the plugs 216b are not arranged in the central portion of the first semiconductor chip 210.

Figure 9:
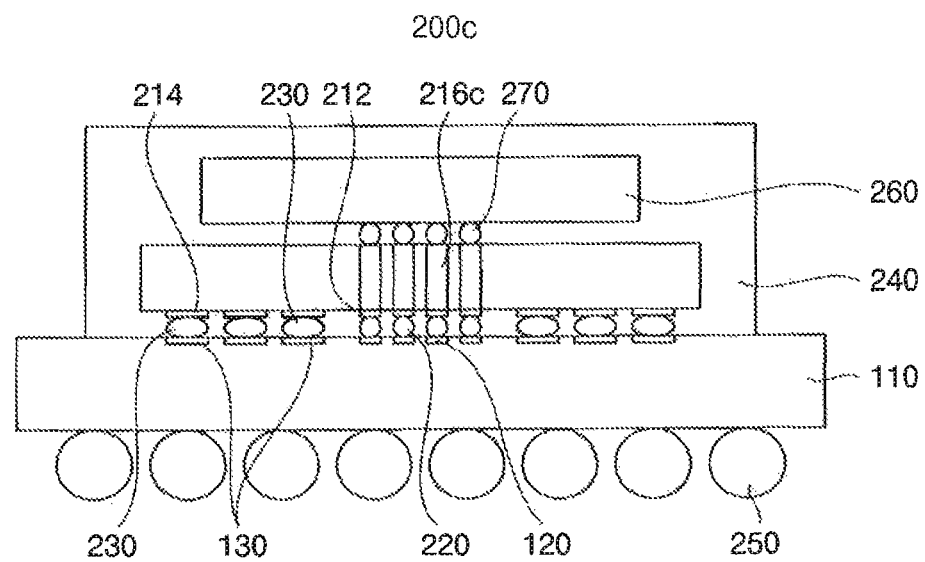

FIG. 9 is a cross-sectional view illustrating a flip chip package in accordance with some example embodiments.

A flip chip package substrate 200c of this example embodiment includes elements substantially the same as those of the package substrate 200a in FIG. 7 except for a first semiconductor chip and dummy bumps.

Referring to FIG. 9, plugs 216c are arranged only in the central portion of the first semiconductor chip 210. That is, the plugs 216c are not be arranged in the edge portion of the first semiconductor chip 210.

In some example embodiments, the edge portion of the first semiconductor chip 210 is weak. As a result, the first semiconductor chip 210 is upwardly bent. In order to prevent the first semiconductor chip 210 from being bent, dummy bumps 230 are interposed between the edge portion of the first semiconductor chip 210 and the package substrate 100.

In some example embodiments, because the dummy bumps 230 are arranged to the outside of and/or adjacent the functional bumps 220, the dummy bumps 230 relieve the stresses applied to the functional bumps 220, as well as prevent the first semiconductor chip 210 from being bent. The functional bumps 220 contact the plugs 216c.

Figure 10:
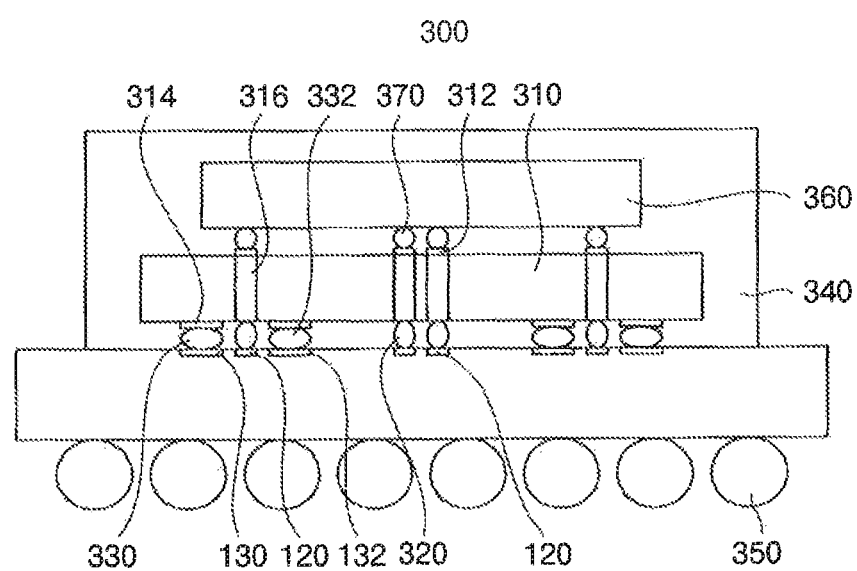

FIG. 10 is a cross-sectional view illustrating a flip chip package in accordance with some example embodiments.

Referring to FIG. 10, a flip chip package 300 of this example embodiment includes a package substrate 100, a first semiconductor chip 310, a second semiconductor chip 360, functional bumps 320, main dummy bumps 330, auxiliary dummy bumps 332, a molding member 340 and external terminals 350.

In some example embodiments, the package substrate 100 of this example embodiment includes substantially the same elements as those of the package substrate 100 in FIG. 1. Alternatively, the flip chip package 300 may include the package substrate 100a in FIG. 3 in place of the package substrate 100 in FIG. 1.

The first semiconductor chip 310 is arranged over the package substrate 100. In some example embodiments, the first semiconductor chip 310 includes an active region where bonding pads 312 are arranged. The active region is electrically connected to structures in the first semiconductor chip 310. The active region is positioned on an upper surface of the first semiconductor chip 310. That is, the active region is arranged away from the package substrate 100. Thus, the first semiconductor chip 310 having the active region may correspond to a face-up semiconductor chip.

Plugs 316 are vertically formed through the first semiconductor chip 310. The plugs 316 are electrically connected to the bonding pads 312. The plugs 316 are exposed through a lower surface of the first semiconductor chip 310.

Additionally, the first semiconductor chip 310 includes floating pads 314. The floating pads 314 are not electrically connected with the structures in the first semiconductor chip 310. In some example embodiments, the floating pads 314 include a metal.

The functional bumps 320 are interposed between the first semiconductor chip 310 and the package substrate 100. In some example embodiments, the functional bumps 320 are interposed between the bonding pads 312 of the first semiconductor chip 310 and the functional patterns 120 of the package substrate 100 to electrically connect the bonding pads 312 with the functional patterns 120. Thus, electrical signals from the first semiconductor chip 310 are transmitted to the functional patterns 120 of the package substrate 100 through the bonding pads 312 and the functional bumps 320.

The main dummy bumps 330 are mounted on the main dummy patterns 130. Thus, the main dummy bumps 330 are arranged to the outside of and/or the functional bumps 320. The auxiliary dummy bumps 332 are mounted on the auxiliary dummy patterns 132. According to an embodiment, the auxiliary dummy bumps 332 surround the functional bumps 320. In some example embodiments, the main dummy bumps 330 and the auxiliary dummy bumps 332 have sizes greater than that of the functional bumps 320. Additionally, the main dummy bumps 330 and the auxiliary dummy bumps 332 are fixed to the floating pads 314 of the first semiconductor chip 310.

The second semiconductor chip 360 is stacked on the first semiconductor chip 310. The second semiconductor chip 360 is electrically connected to the bonding pads 312 of the first semiconductor chip 310 through second functional bumps 370.

The molding member 340 is formed on the package substrate 100 to cover the first semiconductor chip 310 and the second semiconductor chip 360. The external terminals 350 are mounted on a lower surface of the package substrate 100.

According to these example embodiments, the stresses are concentrated on the main dummy patterns arranged adjacent and/or to the outside the functional patterns. In addition, stresses are also absorbed by the auxiliary dummy patterns adjacent the functional patterns. Thus, the stresses are not concentrated on the functional patterns. As a result, damage to the functional bumps caused by the stresses is suppressed.

The foregoing is illustrative of example embodiments and is not to be construed as limiting thereof. Although a few example embodiments have been described, those skilled in the art will readily appreciate that many modifications are possible in the example embodiments without materially departing from the novel teachings of the present inventive concept. Accordingly, all such modifications are intended to be included within the scope of the present inventive concept as defined in the claims.

What is claimed is:

1. A package substrate comprising:
   an insulating substrate on which a semiconductor chip is arranged;
   a functional pattern formed on the insulating substrate, wherein the functional pattern is electrically connected to the semiconductor chip; and
   a main dummy pattern formed on a portion of the insulating substrate at least one of to an outside of or adjacent the functional pattern, wherein the main dummy pattern is oriented in a path of stress on the insulating substrate generated by a difference between thermal expansion coefficients of the insulating substrate and the semiconductor chip, and
   an auxiliary dummy pattern adjacent to the functional pattern, the auxiliary dummy pattern and the main dummy pattern surrounding the functional pattern.

2. The package substrate of claim 1, wherein the main dummy pattern is substantially perpendicular to a direction of the stress.

3. The package substrate of claim 1, wherein the main dummy pattern has an area greater than an area of the functional pattern.

4. The package substrate of claim 1, wherein the auxiliary dummy pattern is substantially perpendicular to a direction of the stress.

5. The package substrate of claim 1, wherein the auxiliary dummy pattern has an area greater than an area of the functional pattern.

6. The package substrate of claim 1, wherein the functional pattern is substantially parallel with a direction of the stress.

7. A flip chip package comprising:
a semiconductor chip; a package substrate including an insulating substrate on which the semiconductor chip is arranged, a functional pattern formed on the insulating substrate, and a main dummy pattern formed on a portion of the insulating substrate;
a functional bump mounted on the functional pattern to electrically connect the semiconductor chip with the functional pattern; and
a main dummy bump mounted on the main dummy pattern, the main dummy bump located at least one of to an outside of or adjacent the functional bump, wherein the main dummy bump is oriented in a path of stress on the insulating substrate generated by a difference between thermal expansion coefficients of the insulating substrate and the semiconductor chip, wherein the package substrate further comprises an auxiliary dummy pattern adjacent to the functional pattern, and an auxiliary dummy bump is mounted on the auxiliary dummy pattern.

8. The flip chip package of claim 7, wherein the main dummy bump has a size greater than a size of the functional bump.

9. The flip chip package of claim 7, further comprising a floating pad between the main dummy bump and the semiconductor chip.

10. The flip chip package of claim 7, wherein the auxiliary dummy bump has a size greater than a size of the functional bump.

11. The flip chip package of claim 7, further comprising a floating pad interposed between the auxiliary dummy bump and the semiconductor chip.

12. The flip chip package of claim 7, further comprising a molding member formed on the package substrate and covering the semiconductor chip.

13. The flip chip package of claim 7, further comprising external terminals mounted on a lower surface of the package substrate.

14. A flip chip package comprising:
a package substrate including an insulating substrate, a functional pattern formed on the insulating substrate, and a main dummy pattern formed on a portion of the insulating substrate;
a first semiconductor chip mounted on the package substrate, the first semiconductor chip having a plug formed through the first semiconductor chip;
a second semiconductor chip stacked on the first semiconductor chip;
a functional bump between the plug and the functional pattern to electrically connect the first semiconductor chip with the functional pattern; and
a main dummy bump mounted on the main dummy pattern, the main dummy bump located at least one of to an outside of or adjacent the functional bump, wherein the main dummy bump is oriented in a path of stress on the insulating substrate generated by a difference between thermal expansion coefficients of the insulating substrate and the first semiconductor chip.

15. The flip chip package of claim 14, wherein an active region of the first semiconductor chip is arranged facing the package substrate.

16. The flip chip package of claim 14, wherein an active region of the first semiconductor chip is arranged away from the package substrate.

17. The flip chip package of claim 14, wherein the plug is arranged in an edge portion of the first semiconductor chip that does not make contact with the second semiconductor chip.

18. The flip chip package of claim 14, wherein the plug is arranged in a central portion of the first semiconductor chip that makes contact with the second semiconductor chip.

\* \* \* \* \*